US008809866B2

(12) United States Patent
Iwasaki et al.

(10) Patent No.: US 8,809,866 B2
(45) Date of Patent: Aug. 19, 2014

(54) LIGHT EMITTING DEVICE AND ELECTRONIC APPARATUS

(71) Applicant: Seiko Epson Corporation, Tokyo (JP)

(72) Inventors: Masanori Iwasaki, Shiojiri (JP); Shin Fujita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/940,846

(22) Filed: Jul. 12, 2013

(65) Prior Publication Data

US 2014/0027792 A1 Jan. 30, 2014

(30) Foreign Application Priority Data

Jul. 27, 2012 (JP) ................. 2012-166729

(51) Int. Cl.
*H01L 21/02* (2006.01)
*H01L 33/08* (2010.01)
*H01L 27/32* (2006.01)
*H01L 33/36* (2010.01)
*H01L 51/52* (2006.01)

(52) U.S. Cl.
CPC ......... *H01L 33/08* (2013.01); *H01L 2251/5315* (2013.01); *H01L 27/3216* (2013.01); *H01L 51/5265* (2013.01); *H01L 27/3246* (2013.01); *H01L 33/36* (2013.01)
USPC ........ 257/72; 257/88; 257/315; 257/E27.016; 257/E29.006; 257/E33.053

(58) Field of Classification Search
CPC ............ H01L 21/3145; H01L 21/7624; H01L 27/1214; H01L 27/3258; H01L 29/78621; H01L 29/78603; H01L 29/78645
USPC ......... 257/72, 88, 315, E27.016, 111, 29.006, 257/278, 285, 33.053
See application file for complete search history.

(56) References Cited

U.S. PATENT DOCUMENTS

| 6,366,025 | B1  |   | 4/2002 | Yamada |
|-----------|-----|---|--------|--------|
| 6,689,492 | B1  | * | 2/2004 | Yamazaki et al. ............ 428/690 |
| 6,777,716 | B1  | * | 8/2004 | Yamazaki et al. ............ 257/88 |
| 7,198,967 | B2  | * | 4/2007 | Tanaka et al. ................ 438/30 |
| 8,093,808 | B2  | * | 1/2012 | Koshihara .................... 313/506 |
| 2009/0091257 | A1 | * | 4/2009 | Yoshinaga .................... 313/505 |

(Continued)

FOREIGN PATENT DOCUMENTS

| JP | A-8-241048   | 9/1996  |
|----|--------------|---------|
| JP | A-2008-300367 | 12/2008 |

(Continued)

*Primary Examiner* — Michael Lebentritt
(74) *Attorney, Agent, or Firm* — Oliff PLC

(57) ABSTRACT

An organic EL device as a light emitting device includes: a first light emitting element that is disposed on a first surface of a substrate and that has a first pixel electrode; a second light emitting element that has a second pixel electrode; and an insulating layer that is provided with a first opening which exposes the first pixel electrode and a second opening which exposes the second pixel electrode. Further, in the organic EL device, the first opening is configured so that the insulating layer covers equal to or more than 50% of the circumferential edge portion of the first pixel electrode, and the second opening is configured so that the insulating layer covers less than 50% of the circumferential edge portion of the second pixel electrode.

20 Claims, 8 Drawing Sheets

(56) References Cited

U.S. PATENT DOCUMENTS

| | | | |
|---|---|---|---|
| 2009/0224260 A1* | 9/2009 | Hayakawa et al. | 257/72 |
| 2010/0124603 A1* | 5/2010 | Ito et al. | 427/66 |
| 2010/0253222 A1* | 10/2010 | Koshihara | 315/32 |
| 2011/0147770 A1 | 6/2011 | Hwang et al. | |
| 2012/0001244 A1* | 1/2012 | Yamazaki et al. | 257/296 |
| 2012/0187411 A1* | 7/2012 | Hayakawa et al. | 257/72 |
| 2012/0299033 A1 | 11/2012 | Goda | |

FOREIGN PATENT DOCUMENTS

| | | |
|---|---|---|
| JP | EP 0 717 445 B1 | 6/2009 |
| JP | A-2011-129510 | 6/2011 |
| JP | A-2011-159406 | 8/2011 |

* cited by examiner

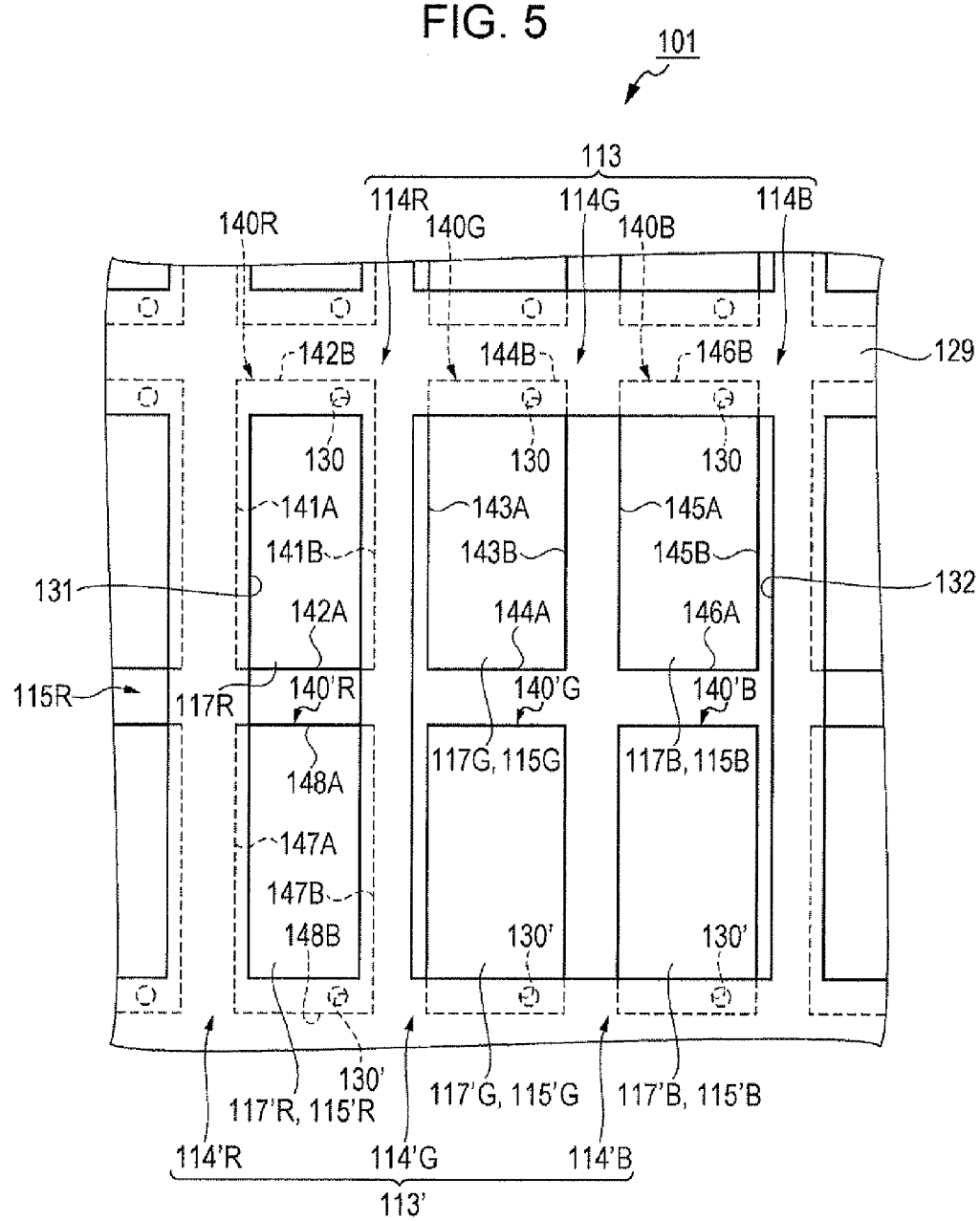

LIGHT EMITTING DEVICE AND ELECTRONIC APPARATUS

BACKGROUND

1. Technical Field

The present invention relates to light emitting devices and electronic apparatuses including the stated light emitting devices.

2. Related Art

An active matrix EL device that includes: EL elements each sandwiching an organic electroluminescence layer between a negative electrode and a positive electrode; and transistors and capacitors for controlling the driving of the EL elements, is widely known. In such EL device, there is provided a passivation layer which has an opening at a position on the positive electrode and whose bottom end extends on the positive electrode so as to electrically insulate the adjacent positive electrodes from each other (JP-A-08-241048).

It is proposed to cause light emitting areas of the EL elements that are provided corresponding to color display pixels (red, green and blue) arranged in a matrix pattern to differ in size from each other in an organic EL display apparatus that includes the EL elements and thin-film transistors as switching elements for driving the EL elements. With this, it is possible to control a phenomenon in which white balance is lost due to a difference in luminance efficiency of light emitting layers depending on the colors and to provide a long-life display apparatus. As methods for causing the light emitting areas of the display pixels to differ from each other, the following two methods are cited (JP-A-2008-300367): that is, a method that changes the area size of the positive electrode, and a method that changes the size of an opening portion in a flattening insulating layer that covers end portions of the positive electrode.

However, as described in JP-A-08-241048 and JP-A-2008-300367, in the case where what is called an insulating layer such as a passivation layer, a flattening insulating layer, or the like covers the end portions of the positive electrode, enhancement of the aperture ratio is limited. On the other hand, as described in JP-A-2008-300367, in the case where the insulating layer does not cover the end portions of the positive electrode, a functional layer containing a light emitting layer is likely to become thinner near the end portions of the positive electrode. If there is a thinned-film portion in the functional layer, an electric current intensively flows in the thinned-film portion, whereby the light emitting element is likely to be deteriorated. In the case where a light emitting element of a specific color is deteriorated, the corresponding reproducible color range is unfavorably changed so that the display quality is lowered.

SUMMARY

An advantage of some aspects of the invention is to solve at least part of the above problem, and the invention can be embodied in the following embodiments or application examples.

Application Example 1

A light emitting device according to this application example includes: a substrate; a first light emitting element that is disposed above a first surface of the substrate, that has a first pixel electrode, an opposing electrode, and a functional layer containing a light emitting layer and being arranged between the first pixel electrode and the opposing electrode, and that emits first light; a second light emitting element that is disposed above the first surface of the substrate, that has a second pixel electrode, an opposing electrode, and a functional layer containing a light emitting layer and being arranged between the second pixel electrode and the opposing electrode, and that emits second light; and an insulating layer that is disposed between the first surface and the functional layer via the first and second pixel electrodes, and that has a first opening which exposes the first pixel electrode and a second opening which exposes the second pixel electrode. Further, in the above light emitting device, the first opening is configured so that the insulating layer covers equal to or more than 50% of the circumferential end portion of the first pixel electrode, and the second opening is configured so that the insulating layer covers less than 50% of a circumferential end portion of the second pixel electrode.

According to this application example, of the first and second light emitting elements, in the first light emitting element whose functional layer is likely to have a thinned-film portion in the vicinity of the circumferential edge portion of the first pixel electrode, for example, equal to or more than 50% of the circumferential edge portion of the first pixel electrode is covered by the insulating layer. With this, an electric current is unlikely to flow in a portion of the functional layer that is formed on a region where the first pixel electrode is covered by the insulating layer, thereby making it possible to prevent an electric current from flowing intensively in the portion of the functional layer where the film thickness thereof is thinner. Therefore, it is possible to suppress the deterioration of a light emitting element of a specific color. Further, of the first and second light emitting elements, in the second light emitting element whose functional layer is unlikely to have a thinned-film portion in the vicinity of end portions of the second pixel electrode, less than 50% of the circumferential edge portion of the second pixel electrode is covered by the insulating layer. With this, it is possible to have a wider contact area between the second pixel electrode and the functional layer in comparison with a case in which all the circumferential edge portion of the second pixel electrode is covered by the insulating layer. In other words, it is possible to enhance the aperture ratio in comparison with the past-technique light emitting devices. It is to be noted that in this specification, the aperture ratio refers to a ratio of a light emitting area to the whole area of a single pixel or a single sub-pixel, and the light emitting area refers to a contact area between the pixel electrode and the functional layer. With this configuration, it is possible to provide a light emitting device having a larger aperture ratio and excellent display quality with little color drift.

Application Example 2

In the light emitting device according to the above application example, it is preferable that the first pixel electrode and the second pixel electrode be formed in a planar shape in which the length in a first direction is longer than the length in a second direction intersecting with the first direction, that the first opening be configured so that the insulating layer covers at least an end portion along the first direction of the circumferential edge portion of the first pixel electrode, and that the second opening be configured so that the insulating layer covers at least a part of an end portion along the second direction of the circumferential edge portion of the second pixel electrode.

With this, it possible to suppress the deterioration of a light emitting element of a specific color, and to efficiently contribute to the enhancement of the aperture ratio. Accordingly, a light emitting device having further excellent display quality can be provided.

Application Example 3

It is preferable that the light emitting device according to the above application example further include: a first pixel circuit that is disposed between the first surface and the first pixel electrode and that controls driving of the first light emitting element; a first connecting portion that connects the first pixel electrode with the first pixel circuit; a second pixel circuit that is disposed between the first surface and the second pixel electrode and that controls driving of the second light emitting element; and a second connecting portion that connects the second pixel electrode with the second pixel circuit. Further, it is also preferable that the insulating layer be formed overlapping the first connecting portion and the second connecting portion when viewed from the first direction.

In the connecting portion for connecting the pixel electrode with the pixel circuit, unevenness is likely to be generated in comparison with its periphery and the film thickness of the functional layer is likely to become thinner.

In the light emitting device of this application example, since the insulating layer is formed overlapping the first and second connecting portions, it is possible to prevent an electric current from flowing intensively in these portions of the functional layer. This makes it possible to provide a light emitting device having excellent display quality with little color drift.

Application Example 4

In the light emitting device according to the above application example, it is preferable that the first connecting portion be disposed at the side of an end portion along the second direction of the circumferential end portion of the first pixel electrode, and that the second connecting portion be disposed at the side of an end portion along the second direction of the circumferential end portion of the second pixel electrode.

In the light emitting device of this application example, the first connecting portion and the second connection portion are disposed respectively on the same side of the first pixel electrode and the second pixel electrode. This makes it possible to prevent the aperture ratio from decreasing largely in the case where the insulating layer is so provided as to cover the first connecting portion and the second connecting portion.

Application Example 5

In the light emitting device according to the above application example, it is preferable that thickness of the second pixel electrode be thinner than that of the first pixel electrode.

As the thickness of the pixel electrode of a light emitting element is thicker, the film thickness of the functional layer in the vicinity of the end portion of the pixel electrode is likely to become thinner in the light emitting element. Therefore, if an electric current flows intensively in the above thinned-film portion, the functional layer of the light emitting element is likely to be deteriorated.

According to this application example, since the thickness of the second pixel electrode having the portions uncovered by the insulating layer is thinner than that of the first electrode, the film thickness of the functional layer is unlikely to become thinner in the vicinity of the end portions of the second pixel electrode, whereby the second light emitting element is unlikely to be deteriorated in comparison with the first light emitting element. Accordingly, it is possible to provide a light emitting device excellent in display quality and capable of emitting light of high luminance even if the rate of the circumferential end portion of the second pixel electrode that is covered by the insulating layer is less than 50%.

Application Example 6

It is preferable that the light emitting device according to the above application example further include a third light emitting element that is disposed above the first surface, that has a third pixel electrode, an opposing electrode disposed being opposed to the third pixel electrode, and a functional layer containing a light emitting layer and being disposed between the third pixel electrode and the opposing electrode, and that emits third light. Further, in the above light emitting device, it is also preferable that the second light emitting element and the third light emitting element be disposed being adjacent to each other in the second direction, and that the second opening stretch across the second and third pixel electrodes in the first direction intersecting with the second direction and be configured by covering less than 50% of the circumferential end portions of the second and third pixel electrodes.

In the light emitting device of this application example, since a unit pixel can be configured by the three light emitting elements having different emission wavelengths, it is possible to provide a light emitting device that is more excellent in color reproducibility in comparison with a case in which a unit pixel is configured by two light emitting elements. In such light emitting device, of the first through third light emitting elements, the film thickness of the functional layer of the first light emitting element is likely to become thinner in the vicinity of the circumferential edge portion of the pixel electrode; therefore, the insulating layer covers equal to or more than 50% of the circumferential edge portion of the first pixel electrode, thereby making it possible to suppress the deterioration of the first light emitting element. Note that the film thickness of the functional layer of the second light emitting element and the film thickness of the functional layer of the third light emitting element are unlikely to become thinner in the vicinity of the circumferential edge portions of the respective pixel electrodes; therefore, the insulating layer is so configured as to cover less than 50% of the circumferential edge portion of the second pixel electrode of the second light emitting element and of the circumferential edge portion of the third pixel electrode of the third light emitting element. This makes it possible to widen the light emitting area and to enhance the aperture ratio in comparison with a configuration in which the insulating layer covers all the circumferential edge portions of the second and third pixel electrodes. With this, a light emitting device with a larger aperture ratio and excellent display quality can be provided.

Application Example 7

It is preferable that the light emitting device according to the above application example further include: reflective layers that are disposed between the first surface and the first, second and third pixel electrodes, respectively. In the above light emitting device, it is also preferable that the opposing electrode be a semi-transmissive reflective layer that transmits a part of light emitted from the functional layer and reflects another part of the light emitted therefrom, and that resonator structures be formed between the reflective layers and the semi-transmissive layer respectively in the first, second and third light emitting elements.

In the light emitting device including the resonator structures as described in this application example, because it is possible to intensify light of a specified wavelength to be guided, color purity of the light emitted from the light emitting device can be raised. Accordingly, a light emitting device having a further excellent display quality can be provided.

Application Example 8

It is preferable that the light emitting device according to the above application example further include: a third pixel circuit that is disposed between the first surface and the third pixel electrode and that controls driving of the third light emitting element; and a third connecting portion that connects the third pixel electrode with the third pixel circuit. Further, it is also preferable that the insulating layer overlap with the third connecting portion.

With this, it is possible to provide a light emitting device having excellent display quality with less color drift.

Application Example 9

In the light emitting device according to the above application example, it is preferable for the thickness of the third pixel electrode to be thinner than that of the first pixel electrode.

With this, a light emitting device having excellent display quality with less color drift can be provided.

Application Example 10

It is preferable that the light emitting device according to the above application example further include a fourth light emitting element that is disposed above the first surface, that has a fourth pixel electrode, an opposing electrode, and a functional layer containing a light emitting layer and being disposed between the fourth pixel electrode and the opposing electrode, and that emits the first light. Further, in the above light emitting device, it is also preferable that the first light emitting element and the second light emitting element be disposed being adjacent to each other in the second direction, that the first light emitting element and the fourth light emitting element be disposed being adjacent to each other in the first direction intersecting with the second direction, and that the first opening stretch across the first and fourth pixel electrodes in the second direction and be configured so that the insulating layer covers equal to or more than 50% of the circumferential end portions of the first and fourth pixel electrodes.

In the light emitting device of this application example, the first light emitting element that emits the first light and the fourth light emitting element that also emits the first light are disposed line-symmetrically. Further, since the first opening that exposes both the first pixel electrode and the fourth pixel electrode can be formed integrally as one unit, the manufacturing method of the device can be further simplified. Moreover, since an insulating layer that separates the first and fourth pixel electrodes from each other need not be disposed between the first and fourth pixel electrodes, it is possible to shorten the interval between the first and fourth light emitting elements and to provide a high-resolution light emitting device.

Further, even if each of the first light emitting element and the fourth light emitting element is such a light emitting element that has a functional layer whose film thickness is likely to be thinner near the end portions of respective pixel electrodes, it is possible to suppress the deterioration of the first and fourth light emitting elements because equal to or more than 50% of each of the circumferential edge portions of the pixel electrodes is covered by the insulating layer in comparison with a configuration in which the circumferential edge portions of the pixel electrodes are not covered at all by the insulating layer. Furthermore, because respective parts of the circumferential edge portions of the first and fourth pixel electrodes are not covered by the insulating layer, the aperture ratio can be enhanced in comparison with a configuration in which all the circumferential edge portions are covered by the insulating layer. Therefore, it is possible to provide a light emitting device with high luminance, high resolution, and excellent display quality.

Application Example 11

In the light emitting device according to the above application example, it is preferable that the first pixel electrode and the fourth pixel electrode be formed in a planar shape in which the length in the second direction is shorter than the length in the first direction, and that the first opening be configured so that the insulating layer covers the end portions along the first direction of the circumferential end portions of the first and fourth pixel electrodes and does not cover the end portions located adjacent to each other in the first direction among the end portions formed along the second direction.

With this, it is possible to suppress the deterioration of a light emitting element of a specific color and to contribute to the enhancement of the aperture ratio.

Application Example 12

An electronic apparatus according to this application example includes the light emitting device according to any one of the aforementioned application examples.

According to this application example, since the light emitting device according to any one of the aforementioned application examples is included, it is possible to provide an electronic apparatus that is capable of emitting light of high luminance and excellent in display quality.

BRIEF DESCRIPTION OF THE DRAWINGS

The invention will be described with reference to the accompanying drawings, wherein like numbers reference like elements.

FIG. 5 is a plan view illustrating light emitting elements of a light emitting device according to a second embodiment.

DESCRIPTION OF EXEMPLARY EMBODIMENTS

Figure 1:
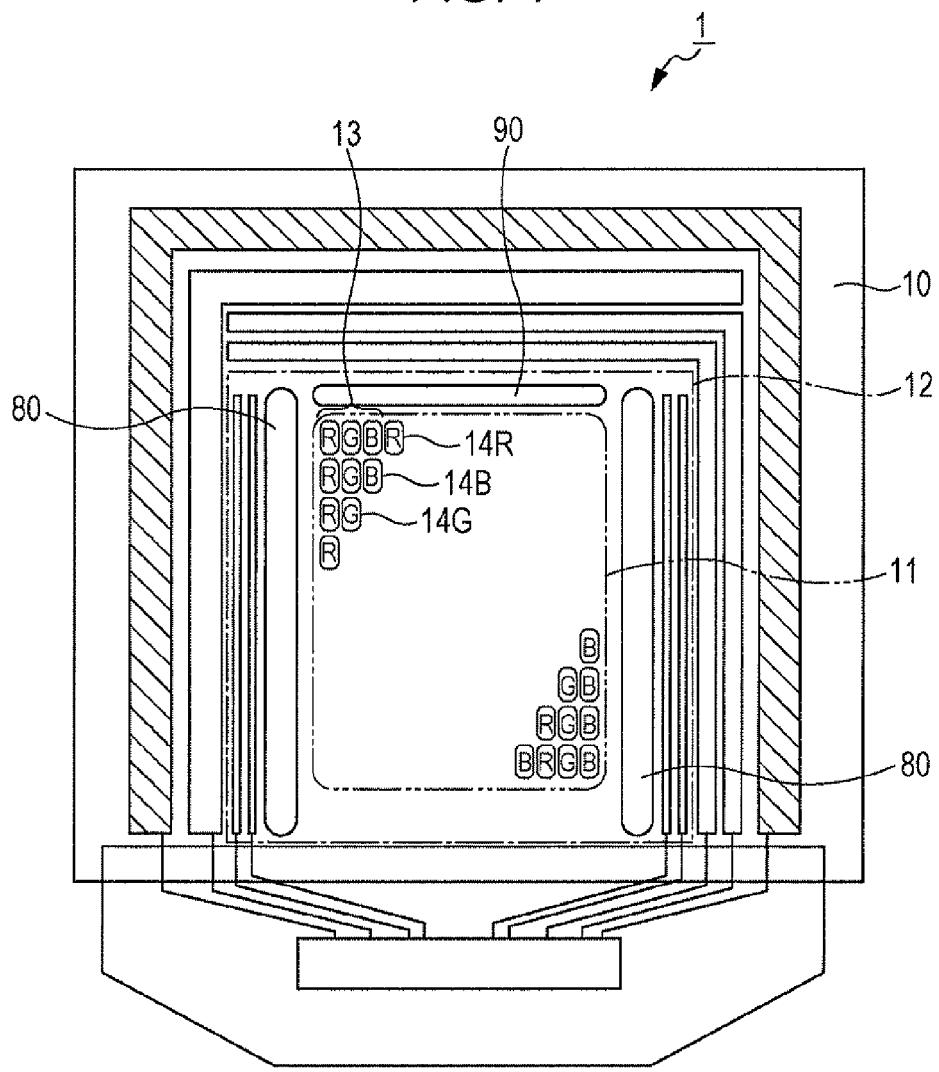
FIG. 1 is a schematic plan view illustrating a basic configuration of a light emitting device according to a first embodiment.

Hereinafter, embodiments of the invention will be described with reference to the drawings. It is to be noted that in the following drawings, scales of the layers, members, and the like are different from and made larger than the actual scales so that they can be visually recognized in the drawings.

First Embodiment

Light Emitting Device

FIG. 1 is a schematic plan view illustrating a basic configuration of a light emitting device according to a first embodiment.

First, the schematic configuration of an organic electroluminescence (EL) device 1 as the light emitting device according to the first embodiment will be described.

As shown in FIG. 1, the organic EL device 1 as the light emitting device of this embodiment includes a substrate 10, a display region 11 provided on a first surface of the substrate 10, and a non-display region 12 provided outside of the display region 11 (a region between the display region 11 and a circumferential edge portion of the substrate 10). A plurality of pixels 13 are disposed in a matrix pattern in the display region 11, and peripheral circuits for making the pixels emit light are provided in the non-display region. As examples of the peripheral circuits, scanning line driving circuits 80, a data line driving circuit 90, an inspection circuit, and the like can be cited.

Each of the plurality of pixels 13 is so configured as to include a plurality of sub-pixels 14, that is, a red (R) sub-pixel 14R, a green (G) sub-pixel 14G, and a blue (B) sub-pixel 14B, for example.

Figure 2:
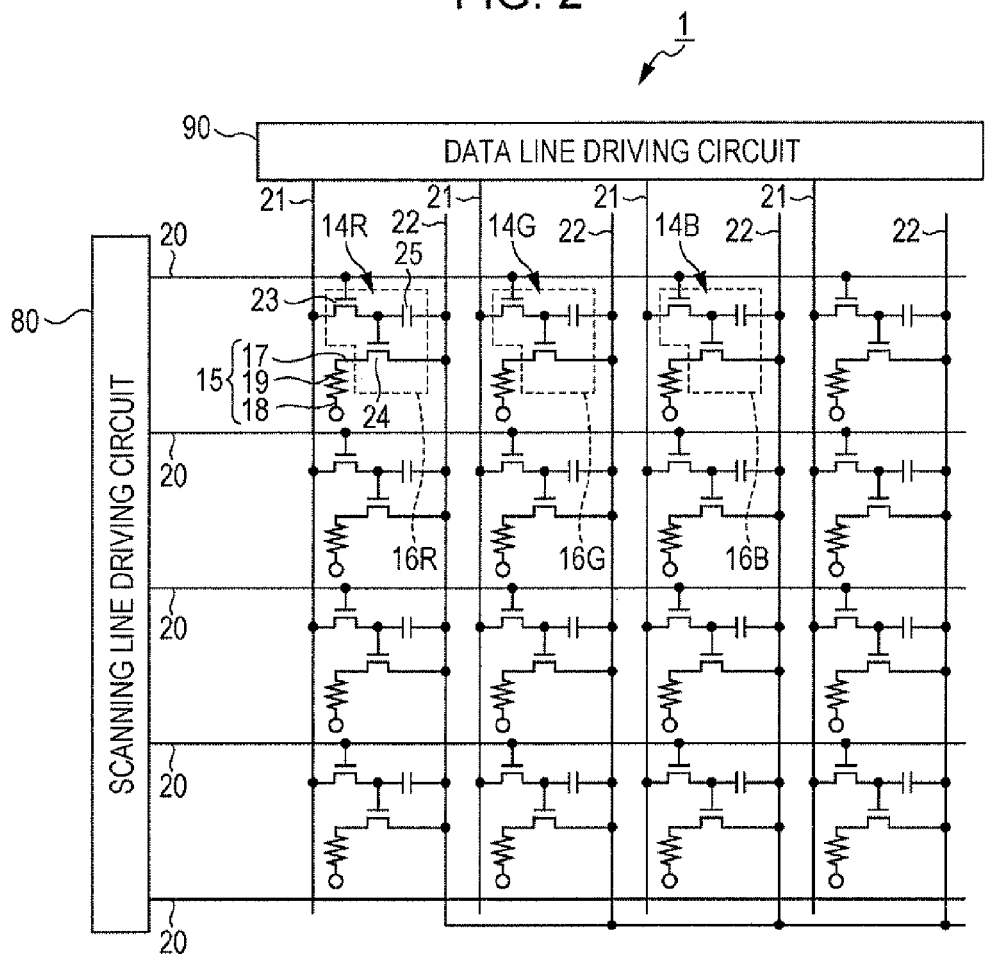
FIG. 2 is an equivalent circuit diagram illustrating an electric configuration of the light emitting device according to the first embodiment.

FIG. 2 is an equivalent circuit diagram illustrating an electric configuration of the light emitting device according to the first embodiment.

As shown in FIG. 2, the organic EL device 1 as the light emitting device of this embodiment includes a plurality of scanning lines 20, a plurality of data lines 21 extending in a direction that intersects with the scanning lines 20, and a plurality of power lines 22 extending in parallel to the data lines 21. The sub-pixels 14 (14R, 14G and 14B) are provided corresponding to the intersections of the scanning lines 20 and the data lines 21. Each of the plurality of sub-pixels 14 includes a light emitting element 15 and a pixel circuit 16 (16R, 16G or 16B) that controls driving of the light emitting element 15.

The light emitting element 15 used in this embodiment is an organic electroluminescence (EL) element that includes a pixel electrode 17, an opposing electrode 18, and a functional layer 19 containing an organic light emitting layer and being disposed between the pixel electrode 17 and the opposing electrode 18. The scanning lines 20 are connected with the scanning line driving circuits 80, and the data lines 21 are connected with the data line driving circuit 90. In this embodiment, each of the power lines 22 is a positive-electrode power line that supplies a potential to the pixel electrode 17 serving as a positive electrode.

Each of the pixel circuits 16 (16R, 16G and 16B) includes a switching transistor 23, a driving transistor 24, and a retention capacitor 25 connected with the gate electrode of the driving transistor 24, and controls the driving of the light emitting element 15. Here, "to control the driving of the light emitting element 15" refers to an operation that makes the light emitting element 15 emit light during a light emitting period of time based on a data signal supplied via the data line 21 during a writing period of time. A scanning signal is supplied to the gate electrode of the switching transistor 23 via the scanning line 20; in the case where this switching transistor 23 is in the on-state, the data signal supplied from the data line 21 is retained in the retention capacitor 25.

In the case where the driving transistor 24 is in the on-state, the pixel electrode 17 and the power line 22 are electrically connected with each other via the driving transistor 24 so that an amount of electric current in proportion to the potential of the data signal retained in the retention capacitor 25 is supplied to the light emitting element 15. The light emitting element 15 emits light at a level of luminance corresponding to the supplied amount of electric current.

Figure 3A:
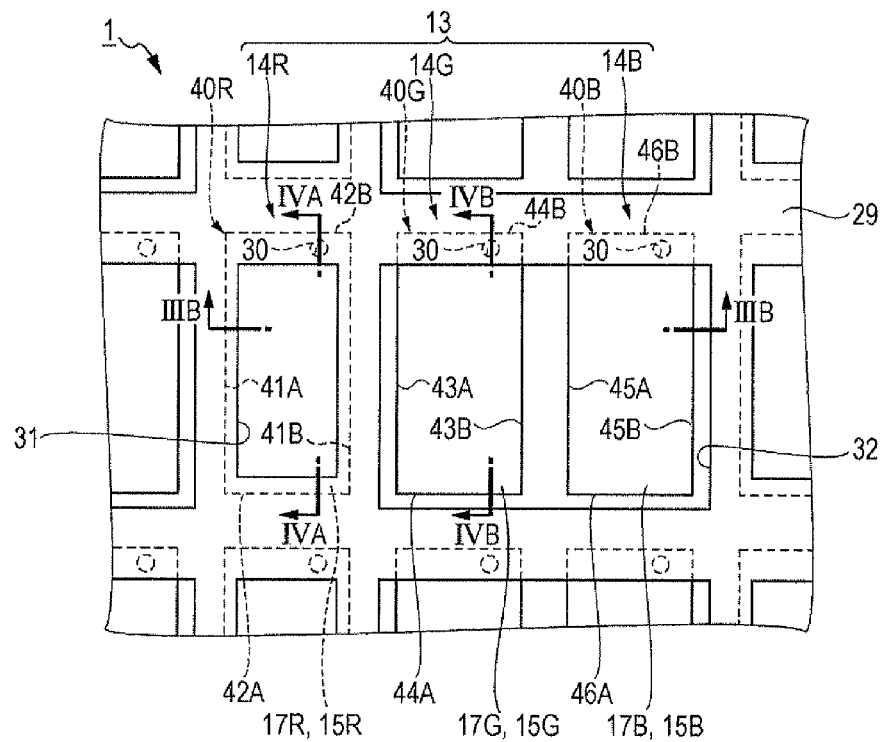
FIG. 3A is a plan view illustrating light emitting elements of the light emitting device according to the first embodiment.
Figure 3B:
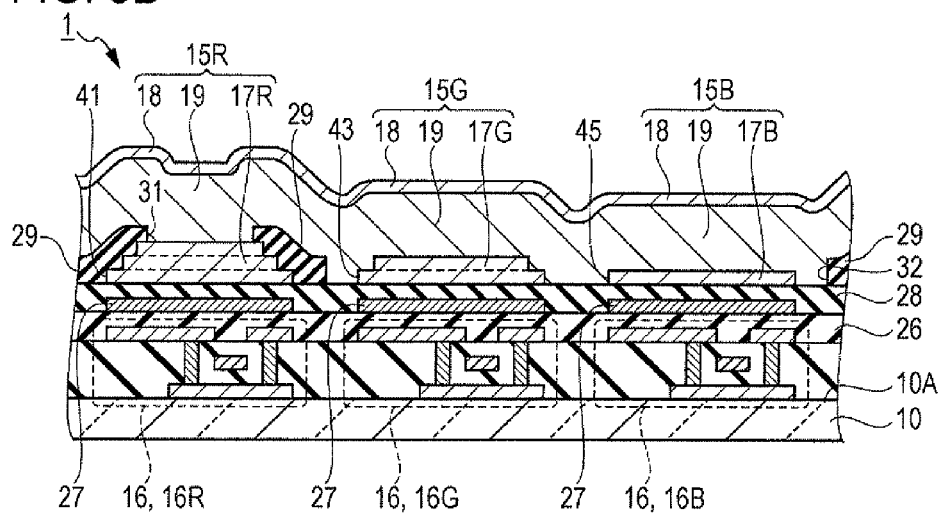
FIG. 3B is a cross-sectional view illustrating the light emitting elements of the light emitting device according to the first embodiment.
Figure 4A:
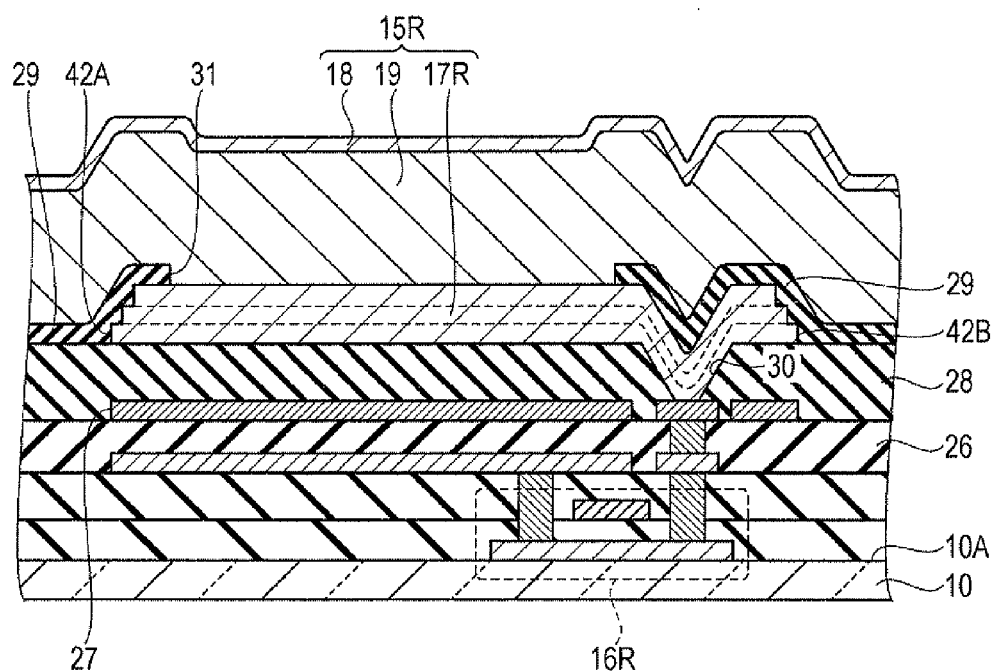
FIGS. 4A and 4B are cross-sectional views illustrating the light emitting elements of the light emitting device according to the first embodiment.
Figure 4B:
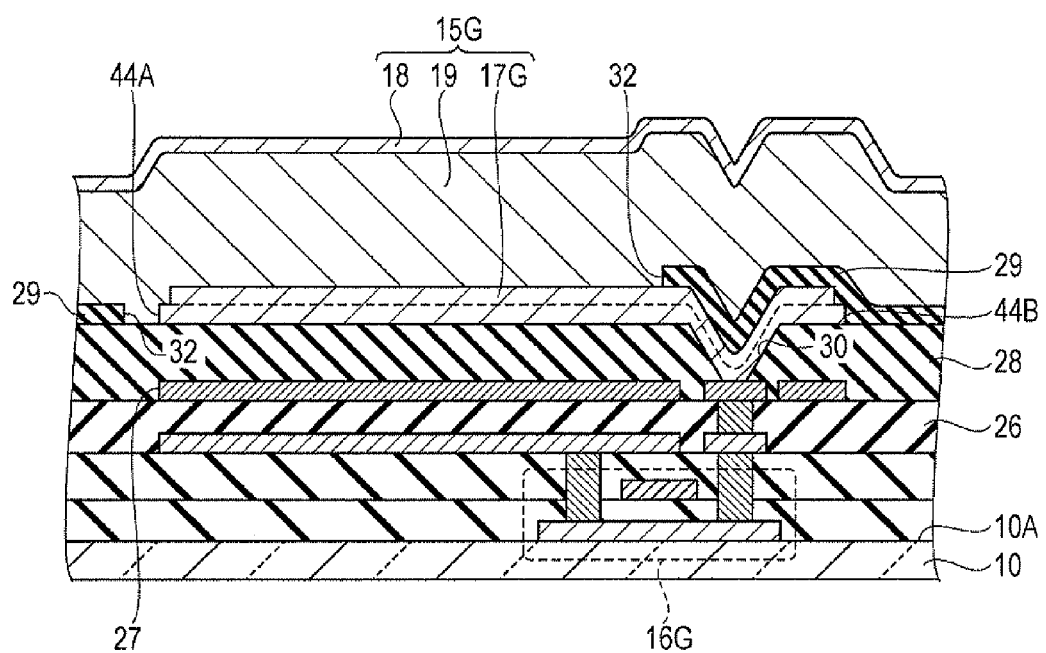

FIG. 3A is a plan view illustrating light emitting elements of the light emitting device according to the first embodiment, and FIG. 3B is a cross-sectional view illustrating the light emitting elements of the light emitting device according to the first embodiment. FIGS. 4A and 4B are cross-sectional views illustrating the light emitting elements of the light emitting device according to the first embodiment. To be more specific, FIG. 3A is a plan view illustrating the structure of the sub-pixels 14 disposed in the display region 11 of the organic EL device 1, and FIG. 3B is a cross-sectional view taken along a IIIB-IIIB line in FIG. 3A. FIG. 4A is a cross-sectional view of a light emitting element 15R taken along a IVA-IVA line in FIG. 3A, and FIG. 4B is a cross-sectional view of a light emitting element 15G taken along a IVB-IVB line in FIG. 3A.

As shown in FIG. 3A, each of the sub-pixels 14 configuring the pixel 13 in this embodiment is formed in a shape such that the length in a first direction (a IVA-IVA direction in FIG. 3A) along a first surface 10A (FIG. 3B) of the substrate 10 is longer than the length in a second direction (a IIIB-IIIB direction in FIG. 3A) that extends along the first surface 10A and intersects with the first direction (for example, a rectangular shape).

The red sub-pixel 14R, the green sub-pixel 14G, and the blue sub-pixel 14B are disposed along the second direction; the light emitting element 15R as a first light emitting element is disposed in the red sub-pixel 14R; the light emitting element 15G as a second light emitting element is disposed in the green sub-pixel 14G; a light emitting element 15B as a third light emitting element is disposed in the blue sub-pixel 14B.

As shown in FIG. 3B and FIGS. 4A and 4B, the organic EL device 1 of this embodiment is so configured as to include the substrate 10, the pixel circuits 16 (16R, 16G and 16B) formed on the first surface 10A of the substrate 10, a flattening surface 26 formed on the pixel circuits 16 (16R, 16G and 16B), reflective layers 27 disposed on the flattening layer 26, the pixel electrodes 17 disposed on the reflective layers 27 via an inter-layer insulating layer 28, an insulating layer 29 that is formed covering part of the inter-layer insulating layer 28 and part of the pixel electrodes 17, the functional layer 19 containing the organic light emitting layer and being formed on the pixel electrodes 17 (17R, 17G and 17B), and the opposing electrode 18 formed on the functional layer 19.

The pixel electrode 17R, the functional layer 19, and the opposing electrode 18 configure the light emitting element 15R; the pixel electrode 17G, the functional layer 19, and the opposing electrode 18 configure the light emitting element 15G. Likewise, the pixel electrode 17B, the functional layer 19, and the opposing electrode 18 configure the light emitting element 15B.

The organic EL device 1 of this embodiment adopts a top emission system in which light is guided from the opposing electrode 18 side. Accordingly, the substrate 10 may be a transparent substrate made of a material such as resin, quartz glass, soda glass, or the like; alternatively, the substrate 10 may be a nontransparent substrate that is made of a substrate configured with a ceramic material, a metallic material, and the like.

The switching transistor 23 and the driving transistor 24 are constituent elements of the pixel circuit 16; each of the transistors includes a semiconductor region in which a source region, a drain region and a channel region are formed, and the gate electrode that is formed being opposed to the channel region. These transistors configuring the pixel circuit 16 may be a thin-film transistor, or a field-effect transistor (MOS transistor) formed on a semiconductor substrate such as a bulk-silicon substrate.

In a layer between the first surface 10A and the light emitting element 15 within the display region 11, the scanning line 20 that supplies a scanning signal to the gate electrode of the switching transistor 23, the data line 21 that supplies a data signal to be retained by the retention capacitor 25, the power line 22 that supplies an electric current to be supplied to the light emitting element 15, and the like are also disposed. Note that only part of the constituent elements of the pixel circuit 16 is illustrated in FIG. 3B and FIGS. 4A and 4B.

On the pixel circuit 16, the reflective layer 27 made of an insulating material such as silicon oxide, silicon nitride, silicon oxynitride, or the like is disposed via the flattening layer 26. The reflective layer 27 reflects the light emitted toward the reflective layer 27 side from the organic light emitting layer, which will be explained later, back to the organic light emitting layer side. In addition, the reflective layer 27 forms a resonator structure between the reflective layer 27 and the opposing electrode 18, which will be explained later. As a material used in the reflective layer 27, Al and its alloy, Ag and its alloy, or the like can be cited.

In this embodiment, although the reflective layers 27 are separately provided corresponding to each of the sub-pixels 14R, 14G and 14B, the invention is not limited thereto; the reflective layer 27 may be formed extending across the plurality of sub-pixels 14R, 14G and 14B. In such case, the reflective layer 27 need be electrically isolated from the pixel circuits 16R, 16G and 16B. Openings may be provided in the reflective layer 27 at the regions overlapping with contact holes 30, and the sub-pixels 14R, 14G and 14B may be respectively connected with the pixel circuits 16R, 16G and 16B through these openings.

On the reflective layer 27, the pixel electrode 17 is disposed via the inter-layer insulating layer 28 made of silicon oxide, silicon nitride, silicon oxynitride, or the like. In the inter-layer insulating layer 28, there is provided a connecting portion for connecting the pixel electrode 17 with the pixel circuit 16. In this embodiment, the pixel electrode 17 is a transparent electrode made of indium tin oxide (ITO), indium zinc oxide (IZO) or the like, and functions as a positive electrode. The connecting portion includes the contact hole 30. It is advisable that the contact hole 30 be provided at a position where a portion of the pixel electrode 17 to be connected with the pixel circuit 16 is located on the corner of the pixel electrode 17. Further, in this embodiment, as shown in FIG. 3A, the contact holes 30 are provided on the same side of the sub-pixels 14R, 14G and 14B.

As shown in FIGS. 3A and 3B, the insulating layer 29 in which openings for exposing a large part of the pixel electrodes 17R, 17G and 17B are provided is disposed extending across the sub-pixels 14R, 14G and 14B. The insulating layer 29 is made of an insulating material such as silicon oxide, silicon nitride, silicon oxynitride, or the like, and is formed with a film thickness of approximately 5 nm to 100 nm. In a region where the insulating layer 29 overlaps the pixel electrode 17 when viewed from top, the insulating layer 29 is interposed between the pixel electrode 17 and the functional layer 19 while making contact with both the pixel electrode 17 and the functional layer 19, which makes it difficult for an electric current to flow in the above region where the insulating layer 29 overlaps the pixel electrode 17. Therefore, the emission of light from the functional layer 19 is suppressed. Regions where the pixel electrodes 17R, 17G and 17B respectively make contact with the functional layer 19, are the regions that are intended to be light emitting regions of the light emitting elements 15R, 15G and 15B.

In this embodiment, a first opening 31 and a second opening 32 are provided in the insulating layer 29. The first opening 31 exposes the pixel electrode 17R of the light emitting element 15R at a stage before forming the functional layer 19, and then the pixel electrode 17R makes contact with the functional layer 19 via the first opening 31 at a stage after the formation of the functional layer 19. A circumferential edge portion 40R of the pixel electrode 17R is all covered by the insulating layer 29.

The second opening 32 exposes the pixel electrode 17G of the light emitting element 15G and the pixel electrode 17B of the light emitting element 15B at a stage before forming the functional layer 19, and then the pixel electrodes 17G and 17B respectively make contact with the functional layer 19 via the second opening 32 at a stage after the formation of the functional layer 19. In other words, the second opening 32 is provided as a common opening stretching across the light emitting elements 15G and 15B, and the insulating layer 29 is not disposed at least in a part of a region between the sub-pixels 14G and 14B that are arranged in the second direction.

Circumferential edge portions 40 (40R, 40G and 40B) of the pixel electrodes 17R, 17G and 17B are each configured of end portions along the first direction and end portions along the second direction. In this embodiment, the length of the end portion along the first direction is longer than the length of the end portion along the second direction. Hereinafter, the end portions along the first direction of the pixel electrode 17R are referred to as first end portions 41, and the end portions along the second direction thereof are referred to as second end portions 42. Likewise, the end portions along the first direction of the pixel electrode 17G are referred to as third end portions 43, and the end portions along the second direction thereof are referred to as fourth end portions 44; the end portions along the first direction of the pixel electrode 17B are referred to as fifth end portions 45, and the end portions along the second direction thereof are referred to as sixth end portions 46.

In this embodiment, since the shape of the pixel electrode 17 is rectangular, the pixel electrode 17R has two first end portions; the first end portion farther from the contact hole 30 is referred to as a first end portion 41A while the first end portion closer to the contact hole 30 is referred to as a first end portion 41B. Further, of the two second end portions, the second end portion farther from the contact hole 30 is referred to as a second end portion 42A while the second end portion closer to the contact hole 30 is referred to as a second end portion 42B. In other words, of the four corners of the pixel electrode 17R, a portion of the pixel electrode 17R that is connected with the pixel circuit 16R is located at a position closest to a corner where the first end portion 41B and the second end portion 42B intersect with each other. Likewise, of the third end portions 43, the fourth end portions 44, the fifth end portions 45 and the sixth end portions 46, the end portions farther from each of the contact holes 30 are respectively denoted by 43A, 44A, 45A and 46A, while the end portions closer to each of the contact holes 30 are respectively denoted by 43B, 44B, 45B and 46B.

A large part of the pixel electrode 17G (equal to or more than 50%) and a large part of the pixel electrode 17B (equal to or more than 50%) are not covered by the insulating layer 29. More specifically, in this embodiment, a large part of the third end portions 43 (43A, 43B), a large part of the fifth end portions (45A, 45B), the fourth end portion 44A, and the sixth end portion 46A are not covered by the insulating layer 29. In other words, the second end portions 42 (42A, 42B) of the pixel electrode 17R, the fourth end portion 44B of the pixel electrode 17G, and the sixth end portion 46B of the pixel electrode 17B are respectively covered by the insulating layer 29 (see FIGS. 4A and 4B). In this embodiment, of the circumferential edge portions 40G and 40B of the pixel electrodes 17G and 17B, portions covered by the insulating layer 29 are the portions that overlap with the insulating layer 29 when the insulating layer 29 covers the contact holes 30 while forming the second opening 32 approximately in a rectangular shape.

The functional layer 19 containing the organic light emitting layer is formed on the insulating layer 29 by a vapor deposition method or the like. In this embodiment, the functional layer 19 includes a hole injection layer, a hole transport layer, the organic light emitting layer, an electron transport layer, and an electron injection layer; in addition to these layers, other layers may be provided, or any one of the hole injection layer, the hole transport layer, the electron transport layer, and the electron injection layer may not be provided. Moreover, of these layers, a plurality of layers may be integrally formed as one unit. Further, the functional layer 19 of this embodiment includes a red light emitting layer that emits red light, a green light emitting layer that emits green light, and a blue light emitting layer that emits blue light when an electric current flows between each of the pixel electrodes 17 and the opposing electrode 18. Accordingly, light that includes a beam of light of a red-color wavelength, a beam of light of a green-color wavelength, and a beam of light of a blue-color wavelength is emitted from the functional layer 19; that is, light that is visually recognized as a white color as a whole is emitted. The functional layer 19 is formed being common to a plurality of light emitting elements 15R, 15G and 15B, and is so designed as to have a film thickness of approximately 100 nm to 200 nm.

The opposing electrode 18 is formed on the functional layer 19. In this embodiment, the opposing electrode 18 functions as a negative electrode, and is a semi-transmissive reflective layer that forms the resonator structure between the opposing electrode 18 and the above-described reflective layer 27. The opposing electrode 18 is formed extending across the plurality of light emitting elements 15 (15R, 15G and 15B), and transmits a part of light emitted from the organic light emitting layer and reflects another part of the light toward the reflective layer 27 side. This opposing electrode 18 may be formed by vapor deposition processing in which a metal made of Ag, Al, or an alloy of these metals is thinly deposited, or may be formed by laminating the layers made of different materials from each other.

Further, since the resonator structure is formed between the reflective layer 27 and the semi-transmissive reflective layer, the light emitted from the organic light emitting layer travels back and forth between the reflective layer 27 and the semi-transmissive reflective layer so that only light of a resonant wavelength is guided from the semi-transmissive reflective layer side. At this time, by adjusting an optical distance between the reflective layer 27 and the semi-transmissive reflective layer, only light of a desired wavelength can be guided. In this embodiment, optical distances of the resonator structures in the light emitting elements 15R, 15G and 15B are so designed as to respectively intensify red light in the light emitting element 15R as the first light emitting element, green light in the light emitting element 15G as the second light emitting element, and blue light in the light emitting element 15B as the third light emitting element. In this embodiment, although the optical distances are adjusted by making the thicknesses of the pixel electrodes 17R, 17G and 17B differ from each other, the optical distances may be adjusted by making the film thickness of the inter-layer insulating layer 28 interposed between the pixel electrodes 17 and the reflective layers 27 vary corresponding to the light emitting elements 15R, 15G and 15B, respectively, for example.

It is to be noted that in this specification, the red light refers to light with a wavelength of 600 nm to 700 nm, the green light refers to light with a wavelength of 500 nm to 600 nm, and the blue light refers to light with a wavelength of 400 nm to 500 nm.

Figure 7A:
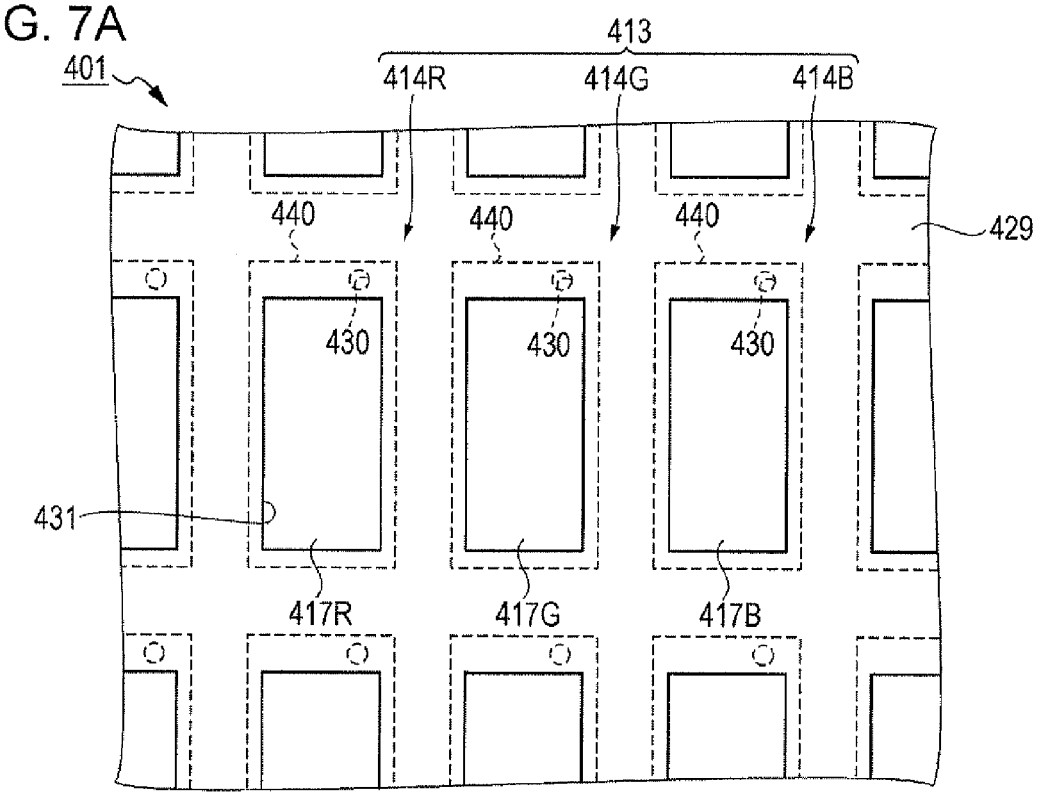
FIGS. 7A and 7B are plan views illustrating light emitting elements of past-technique light emitting devices.
Figure 7B:
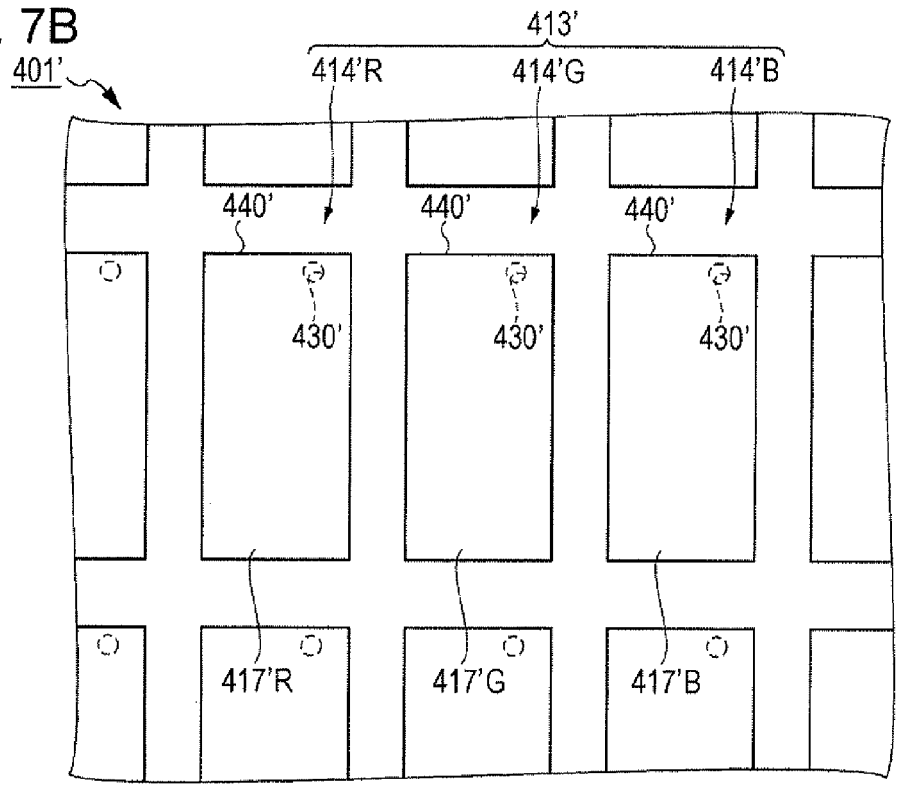
Figure 8:
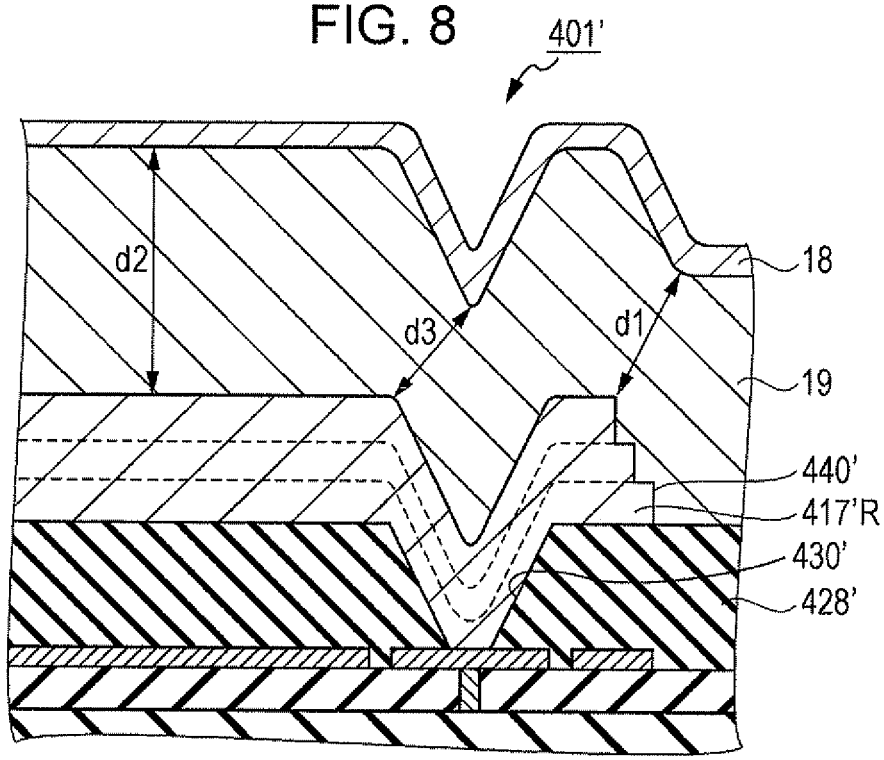
FIG. 8 is a partial cross-sectional view illustrating a light emitting element of a past-technique light emitting device.

The structure of the insulating layer 29 of this embodiment will be described through comparing it with the structures of the past. FIGS. 7A and 7B are plan views illustrating light emitting elements of past-technique light emitting devices. FIG. 8 is a partial cross-sectional view illustrating a light emitting element of the past-technique light emitting device.

As shown in FIG. 7A, in a past-technique light emitting device 401, all of circumferential edge portions 440 of pixel electrodes 417 (417R, 417G and 417B) are fully covered by an insulating layer 429 in a plurality of sub-pixels 414 (414R, 414G and 414B) configuring a pixel 413. In the insulating layer 429, an opening 431 that exposes a large part of the pixel electrode 417 is provided for each of the sub-pixels 414; the pixel electrode 417 makes contact with the functional layer via this opening 431.

In such configuration, since a fixed part of the area of the pixel electrode 417 is covered by the insulating layer 429, enhancement of the aperture ratio is limited. In this specification, the aperture ratio refers to a ratio of a light emitting area to the whole area of a single pixel, and the light emitting area is approximately equal to the area of a region in which the pixel electrode 417 makes contact with the functional layer when viewed from a third direction (normal direction of a substrate on which the organic EL element is disposed).

FIG. 7B is a past-technique light emitting device 401' which is a type of device that does not include an insulating layer to cover circumferential edge portions 440' of pixel electrodes 417' (417'R, 417'G and 417'B) in a plurality of sub-pixels 414' (414'R, 414'G and 414'B). FIG. 8 is a partial cross-sectional view illustrating a contact hole 430' of the red sub-pixel 414'R.

In the past-technique light emitting device 401', as shown in FIG. 7B, the light emitting region is equal to the area of the pixel electrode 417', therefore, the aperture ratio can be enhanced in comparison with the light emitting device 401 as shown in FIG. 7A. However, in the light emitting device 401', as shown in FIG. 8, steps are generated at a portion where a circumferential edge portion 440' of the pixel electrode 417'R is provided and a portion where the contact hole 430' is provided. Accordingly, a film thickness d1 of the functional layer 19 formed in a region near the circumferential edge portion 440' of the pixel electrode 417'R when viewed from top and a film thickness d3 of the functional layer 19 formed at a portion overlapping with the contact hole 430', are likely to be thinner than a film thickness d2 of the functional layer 19 formed on the center portion of the pixel electrode 417'R. The reason for this is as follows: that is, at the time of film formation of the functional layer 19, it may be difficult for the material of the functional layer 19 to reach the above-mentioned portions because unevenness (steps) between an interlayer insulating layer 428' and the pixel electrode 417'R interferes with the movement of the material at the circumferential edge portion 440' of the pixel electrode 417'R.

If there is a thinned-film portion in the functional layer 19, an electric current intensively flows in the thinned-film portion, thereby leading to the deterioration of the light emitting element. If a light emitting device of a specific color is deteriorated, the reproducible color range unfavorably changes so that the display quality is lowered. In this embodiment, it is possible to suppress occurrence of the above problem because the circumferential edge portion 40 of the pixel electrode 17 of such a light emitting element (the red light emitting element 15R, for example) is covered by the insulating layer 29. In addition, because providing the insulating layer 29 alleviates unevenness at the circumferential edge portion 40, inappropriate adhesion of the functional layer 19 can be also resolved. If it is needed to suppress the flow of an electric current in the functional layer 19 formed in a region overlapping with the contact hole 30, this region may be covered by the insulating layer 29.

The above-described effect can be obtained if the insulating layer 29 covers even a small part of the circumferential edge portion 40 of the pixel electrode 17. In order to obtain the above effect for sure, the circumferential edge portion of the first opening 31 may be located inside of the circumferential edge portion of the pixel electrode 17R (closer to the center side of the pixel electrode) by an amount of equal to or more than 0.1 µm, more preferably equal to or more than 0.25 µm. In other words, the distance between the circumferential edge portion 40R of the pixel electrode 17R and the first opening 31 which is 0.1 µm to 0.25 µm, may be covered by the insulating layer 29. With this, the circumferential edge portion 40R can be surely covered even if an error is generated during the manufacturing process. However, in the case where the insulating layer 29 is so formed as to cover the contact hole 30, the distance between the second end portion 42B and the circumferential edge portion of the first opening 31 becomes larger.

This invention is particularly effective in a light emitting device equipped with resonator structures; especially, the invention is effective in a light emitting device in which the optical distance of a resonator in each sub-pixel is adjusted by the thickness of the pixel electrode.

In a light emitting device equipped with resonator structures, since it is possible to intensify light of a wavelength to be guided, the color purity of light emitted from the light emitting device can be enhanced. Therefore, the light emitting device equipped with resonator structures can become a light emitting device having a further excellent display quality. Meanwhile, it is difficult to make the film thickness of the end portion of the pixel electrode and the film thickness of the functional layer formed on the vicinity of the end portion of the pixel electrode be equal to the film thickness of the center portion of the pixel electrode and the film thickness of the functional layer formed on the center portion of the pixel electrode, respectively. Accordingly, in the light emitting device equipped with resonator structures, there is a risk such that light with a different wavelength from the wavelength originally intended to be guided is intensified and emitted from a peripheral region of the end portion of the pixel electrode. If such abnormally-emitted light is mixed into the light emitted from the light emitting element, color drift is generated in the circumferential edge portion 40 of the sub-pixel so as to lower the display quality.

In particular, like in this embodiment, in the case where the thicknesses of the pixel electrodes 17 of the red light emitting element 15R, the green light emitting element 15G, and the blue light emitting element 15B are different from each other, it is widely known that the thickest pixel electrode 17R is formed by laminating a plurality of conductive films. Since it is difficult to laminate a plurality of conductive films in a planar manner without an error, the pixel electrode 17R cannot be formed with a uniform film thickness near the circumferential edge portion of the pixel electrode 17R. In such region, deviation in the optical distance between the reflective layer 27 and the semi-transmissive reflective layer occurs, whereby light of a different wavelength from the desired wavelength is intensified. If such abnormally-emitted light is mixed into the light emitted from the light emitting element, the color drift is caused so as to consequently lower the display quality.

In contrast, in this embodiment, because all the circumferential edge portion of the pixel electrode 17R of the red light emitting element 15R is covered by the insulating layer 29, as shown in FIG. 3A, carrier injection into a portion of the functional layer 19 formed on the circumferential edge portion of the pixel electrode 17R is suppressed. Therefore, light emission from this portion of the functional layer 19 is suppressed and the rate of the abnormally-emitted light contained in the light that is emitted from the light emitting element 15R can be lowered, whereby the organic EL device 1 can have excellent color reproducibility.

The green light emitting element 15G and the blue light emitting element 15B are configured so that equal to or more than 50% of the circumferential edge portion 40G and of the circumferential edge portion 40B, more specifically, a large part of the third end portions 43, a large part of the fifth end portions 45, the fourth end portion 44A, and the sixth end portion 46A are not covered by the insulating layer 29. This makes it possible to enlarge a contact area between the pixel electrode 17G and the functional layer 19 and a contact area between the pixel electrode 17B and the functional layer 19 in comparison with a case in which all of the circumferential edge portions 40G, 40B of the pixel electrodes 17G, 17B are covered by the insulating layer 29. Accordingly, the organic EL device 1 can have a larger aperture ratio with higher luminance.

In this embodiment, as described above, the large part of the circumferential edge portion 40G of the pixel electrode 17G is not covered by the insulating layer 29 in the green light emitting element 15G. It is known that green light can be visually recognized with ease by the human eye in general; even if abnormal light emission occurs on the circumferential edge portion 40G, the generation of color drift in the light emitted from the light emitting element 15G is unlikely to be sensed by the human eye. In this case, the display quality of the organic EL device 1 is not noticeably lowered even with a configuration in which the large part of the circumferential edge portion 40G of the pixel electrode 17G is not covered by the insulation layer 29.

Further, in this embodiment, with regard to the pixel electrode 17B of the blue light emitting element 15B, the large part of the fifth end portions 45 and the sixth end portion 46A are also not covered by the insulating layer 29. In this embodiment, since the film thickness of the pixel electrode 17B is thinner than that of the pixel electrode 17R, film formation of the functional layer 19 can be performed in a relatively uniformed manner at the circumferential edge portion 40B of the pixel electrode 17B. In this case, deviation in the optical distance between the reflective layer 27 and the semi-transmissive reflective layer is so small that abnormal light emission is unlikely to occur in the light emitted from the functional layer 19 formed on the circumferential edge portion 40B of the pixel electrode 17B. Accordingly, the display quality of the organic EL device 1 is not noticeably lowered even with a configuration in which the large part of the circumferential edge portion of the pixel electrode 17B is not covered by the insulating layer 29.

This invention is particularly effective in a light emitting element having a smaller pixel size. In the case where the area of the pixel electrode 17 is relatively large, that is, for example, the long side of the pixel electrode 17 is approximately 100 μm long, even if abnormal light emission occurs at the circumferential edge portion 40 of the pixel electrode 17, the abnormal light emission is unlikely to be visually recognized because the rate of the abnormally-emitted light within the whole light that is emitted from the whole light emitting element 15 is small. However, in the case where the area of the pixel electrode 17 is relatively small, that is, for example, the long side of the pixel electrode 17 comes to be approximately 10 μm long, the rate of the abnormally-emitted light within the light emitted from the light emitting element 15 comes to be relatively large so that the color drift at the circumferential edge portion 40 of the sub-pixel can be noticeably recognized. This invention is particularly effective in a light emitting device in which the long side of the pixel electrode 17 is equal to or less than 10 μm long, further particularly effective in a light emitting device in which the long side of the pixel electrode 17 is equal to or less than 5 μm long.

As described thus far, according to this embodiment, the organic EL device 1 can be provided as a light emitting device with high luminance, excellent display quality, and less color drift.

Second Embodiment

FIG. 5 is a plan view illustrating light emitting elements of a light emitting device according to a second embodiment. The light emitting device according to the second embodiment will be described with reference to FIG. 5. Note that in the following description, the same constituent elements as those in the first embodiment will be given the same reference numerals and duplicate description thereof will be omitted.

In an organic EL device 101 as the light emitting device according to this embodiment, a first red sub-pixel 114R, a first green sub-pixel 114G, and a first blue sub-pixel 114B configuring a first pixel 113, and a second red sub-pixel 114'R, a second green sub-pixel 114'G, and a second blue sub-pixel 114'B configuring a second pixel 113', are disposed line-symmetrically in the first direction (direction in which the same color sub-pixels are arranged). Light emitting elements 115 and 115' are disposed respectively corresponding to the sub-pixels 114 and 114', and the light emitting elements 115 and 115' include pixel electrodes 117 or pixel electrodes 117', the functional layer 19, and the opposing electrode 18.

A pixel electrode 117R of a first red light emitting element 115R disposed in the first red sub-pixel 114R includes first end portions 141A, 141B along the first direction and second end portions 142A, 142E along the second direction. A pixel electrode 117'R of a second red light emitting element 115'R disposed in the second red sub-pixel 114'R includes seventh end portions 147A, 147B along the first direction and eighth end portions 148A, 148B along the second direction. Note that like in the first embodiment, a symbol "A" is attached to the reference numerals of the end portions farther from contact holes 130 and 130', while a symbol "B" is attached to the reference numerals of the end portions closer to the contact holes 130 and 130'.

An insulating layer 129 covers equal to or more than 50% of circumferential edge portions 140R and 140'R of the pixel electrodes 117R and 117'R of the red light emitting elements 115R and 115'R. To be more specific, the insulating layer 129 covers the first end portions 141 (141A and 141B), the second end portion 142B, the seventh end portions 147 (147A and 147B), and the eighth end portion 148B.

A first opening 131 provided in the insulating layer 129 is formed stretching across a part of the pixel electrode 117R of the red light emitting element 115R disposed in the first red sub-pixel 114R and a part of the pixel electrode 117'R of the red light emitting element 115'R disposed in the second red sub-pixel 114'R, and the pixel electrodes 117R and 117'R make contact with the functional layer 19 via the first opening 131. That is, a part of the second end portion 142A and a part of the eighth end portion 148A are not covered by the insulating layer 129, and the insulating layer 129 is not disposed on at least a part of the region between the first red sub-pixel 114R and the second red sub-pixel 114'R.

The light emitting element 115'R of the second red sub-pixel 114'R corresponds to the fourth light emitting element of this invention. Accordingly, the pixel electrode 117'R corresponds to the fourth pixel electrode of this invention.

The insulating layer 129 does not cover a large part (equal to or more than 50%) of circumferential edge portions 140G and 140'G of pixel electrodes 117G and 117'G in green light emitting elements 115G and 115'G. For example, the insulating layer 129 does not cover a large part of third end portions 143 (143A and 143B) of the pixel electrode 117G and a fourth end portion 144A. Likewise, the insulating layer 129 does not cover a large part of fifth end portions 145 (145A and 145B) of a pixel electrode 117B and a sixth end portion 146A.

A second opening 132 provided in the insulating layer 129 is formed stretching across at least a part of the pixel electrode 117G of the first green light emitting element 115G disposed in the first green sub-pixel 114G, at least a part of the pixel electrode 117'G of the second green light emitting element 115'G disposed in the second green sub-pixel 114'G, at least a part of the pixel electrode 117B of a first blue light emitting element 115B disposed in the first blue sub-pixel 114B, and at least a part of a pixel electrode 117'B of a second blue light emitting element 115'B disposed in the second blue sub-pixel 114'B.

The pixel electrodes 117G, 117'G, 117B and 117'B make contact with the functional layer 19 in the second opening 132. In this embodiment, the insulating layer 129 is not disposed on at least a part of the region between the first green sub-pixel 114G and the second green sub-pixel 114'G that are arranged adjacent to each other in the first direction. Likewise, the insulating layer 129 is not disposed on at least a part of the region between the first blue sub-pixel 114B and the second blue sub-pixel 114'B that are arranged adjacent to each other in the first direction. Further, the insulating layer 129 is not disposed on at least a part of the region between the first green sub-pixel 114G and the first blue sub-pixel 114B that are arranged adjacent to each other in the second direction, and also at least a part of the region between the second green sub-pixel 114'G and the second blue sub-pixel 114'B.

If a trouble of light emission occurs in the light emitting elements 115 and 115' in the regions overlapping with the contact holes 130 and 130', the contact holes 130 and 130' may be covered by the insulating layer 129 like in the first embodiment.

Like in this embodiment, in the case where the first opening 131 and the second opening 132 are formed, since the insulating layer 129 need not be disposed on at least a part of the region between the first pixel 113 and the second pixel 113', the distance between the pixels can be shortened so that the organic EL device 101 with a higher resolution can be realized.

Further, in this embodiment, at least a part of the second end portion 142A and at least a part of the eighth end portion 148A that are arranged adjacent to each other in the first direction, are not covered by the insulating layer 129 in the light emitting elements 115R and 115'R. Therefore, it is possible to enlarge the contact areas between the pixel electrodes 117R, 117'R and the functional layer 19 so as to enhance the aperture ratio in comparison with a case in which all of the second end portion 142A and the eighth end portion 148A are covered by the insulating layer 129. Since the enhancement of the aperture ratio consequently makes the light emitting area larger, the organic EL device 101 with a higher luminance can be realized.

Furthermore, in the red light emitting elements 115B and 115'R, because the first end portions 141 and the seventh end portions 147 are covered by the insulating layer 129, the rate of the abnormally-emitted light contained in the light that is emitted from the red light emitting elements 115R and 115'R can be lowered in comparison with the following cases: that is, a case in which part of the first end portions 141 is exposed, a case in which part of the seventh end portions 147 is exposed, and a case in which the circumferential edge portions 140R, 140'R of the pixel electrodes 117R, 117'R are not covered at all by the insulating layer 129. This makes it possible to provide the organic EL device 101 having excellent display quality with less color drift.

The invention is not limited to the above embodiments, and it is possible to appropriately modify the above embodiments without departing from the spirit and scope of the invention that can be understood from the appended aspects of the invention and from the overall description in this specification. It is needless to say that those light emitting devices having experienced such modifications are also included in the technical range of this invention. Various kinds of variations can be found aside from the above embodiments. Hereinafter, such variations will be described.

Figure 6A:
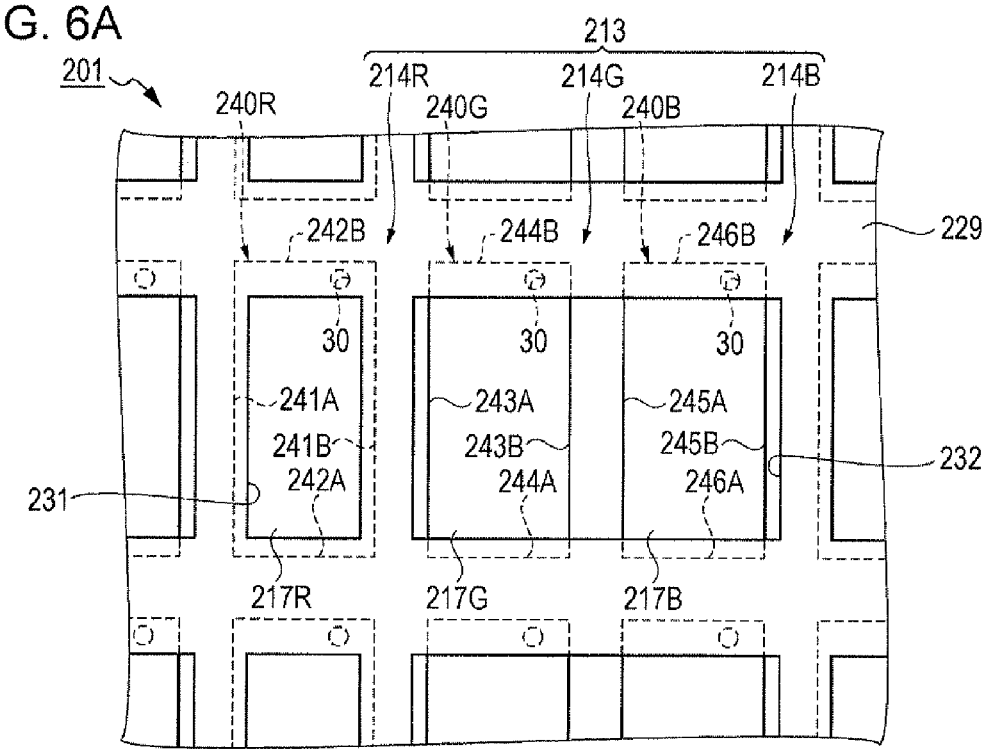
FIGS. 6A and 6B are plan views illustrating light emitting elements of light emitting devices according to variations.
Figure 6B:
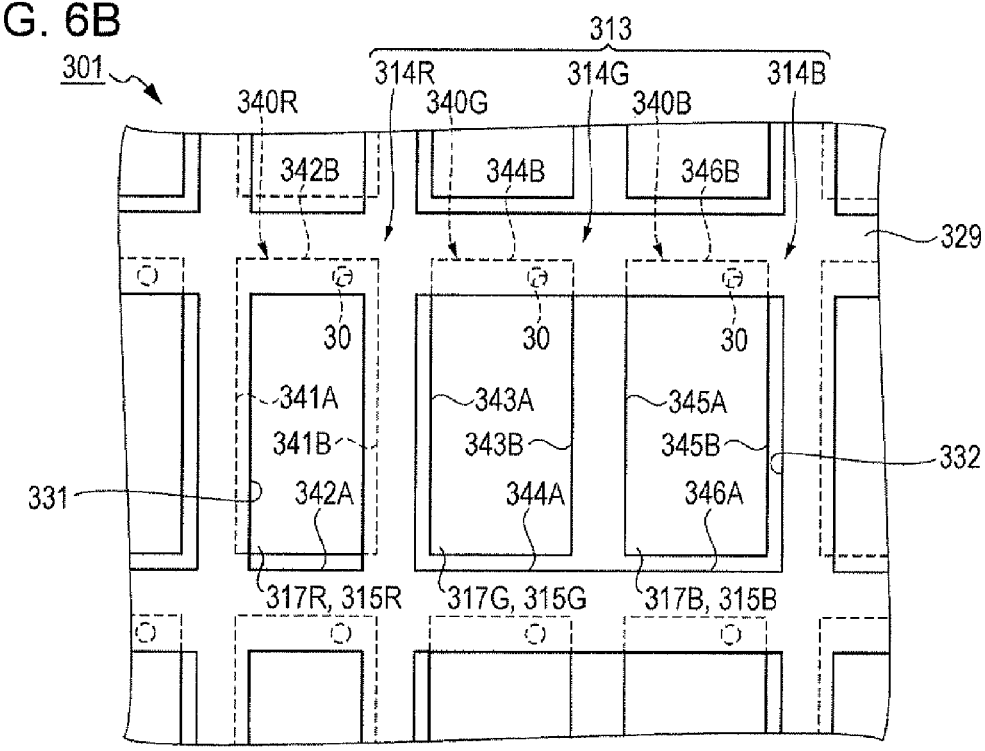

FIG. 6A is a plan view illustrating light emitting elements of a light emitting device according to a variation 1, and FIG. 6B is a plan views illustrating light emitting elements of a light emitting device according to a variation 2.

Variation 1

In the aforementioned first and second embodiments, the sides of the fourth end portions 44A, 144A and the sides of the sixth end portions 46A, 146A are configured so as not to be covered by the insulting layers 29 and 129; however, the invention is not limited thereto. For example, in a light emitting device 201 of the variation 1, as shown in FIG. 6A, a fourth end portion 244A along the second direction of a pixel electrode 217G in a sub-pixel 214G and a sixth end portion 246A along the second direction of a pixel electrode 217B in a sub-pixel 214B that configure a single pixel 213 may be covered by an insulating layer 229; note that the sub-pixels 214G and 214B configure a pixel 213. In other words, with a configuration in which a large part of end portions 243 and of end portions 245 in the longitudinal direction of the pixel electrodes 217G and 217B are not covered by the insulating layer 229, the aperture ratios of the sub-pixels 214G and 214B can be respectively enhanced.

Variation 2

In the aforementioned first embodiment, all the circumferential edge portion of the pixel electrode 17R in the red light emitting element 15R is covered by the insulating layer 29; however, the invention is not limited thereto. For example, in a light emitting device 301 of the variation 2, as shown in FIG. 6B, at least a part of a second end portion 342A (part of an end portion on the side where the contact hole 30 is not provided) of a pixel electrode 317R in a sub-pixel 314R configuring a pixel 313 may be configured so as not to be covered by an insulating layer 329. With this, it is possible to enlarge the light emitting area in comparison with a case in which all of a circumferential edge portion 340R of the pixel electrode 317R of a red light emitting element 315R is covered by the insulating layer 329, whereby the light emitting device 301 with high luminance can be provided.

Variation 3

In the aforementioned first embodiment, although the first end portions 41 and the second end portions 42 of the pixel electrode 17R of the red light emitting element 15R are so configured as to be covered by the insulating layer 29, the invention is not limited thereto. If a noticeable abnormal light emission can be visually recognized in the green light emitting element 15G, at least a part of the circumferential edge portion 40G of the pixel electrode 170 in the light emitting element 15G, or at least a part of the third end portions 43 and the fourth end portions 44 may be covered by the insulating layer 29. If a noticeable abnormal light emission can be visually recognized in the blue light emitting element 15B, at least a part of the circumferential edge portion 40B of the pixel electrode 17B in the light emitting element 15B, or at least a part of the fifth end portions 45 and the sixth end portions 46 may be covered by the insulating layer 29. That is, of the plurality of sub-pixels 14 configuring the pixel 13, two types of the sub-pixels 14 in which a noticeable abnormal light emission can be visually recognized may have the above configuration, for example. The same variation can be made on the configuration of the second embodiment.

Variation 4

Further, in the first embodiment, although the red sub-pixel 14R, the green sub-pixel 14G, and the blue sub-pixel 14B configure one pixel 13, the one pixel 13 may be configured by two of the three types of the sub-pixels 14. As an example, a case in which the blue sub-pixel 14B and a yellow (Y) sub-pixel 14Y configure the one pixel 13 can be cited.

Variation 5

In the first and second embodiments, the modes including the resonator structures are discussed; however, the resonator structures are not essential for the configuration of the invention. That is, in order to use the light emitting device of this invention as a display device for displaying an image or the like, there is a case in which color purity is enhanced by providing a color filter that separates light emitted from a light emitting element. In this case, the resonator structures are not necessarily needed to be employed. However, there is a case in which abnormally-emitted light that is outputted from the functional layer formed on the circumferential edge portion of a pixel electrode cannot be sufficiently absorbed depending on the characteristics of the color filter. If this invention is applied in such case, the rate of the abnormally-emitted light that is mixed in the light emitted from the light emitting element can be reduced, thereby making it possible to provide a light emitting device with excellent display quality.

A color filter formed on another substrate may be bonded, or a protection layer that prevents moisture, oxygen, or the like from reaching the light emitting element may be provided on the negative electrode and thereafter the color filter may be directly formed on the protection layer.

Variation 6

In the first embodiment, the pixel electrode 17 is formed in a rectangular shape; however, the invention is not limited thereto. For example, the pixel electrode 17 may be formed approximately in a rectangular shape with round corners, or may be formed in a polygonal shape, a circular shape, or an elliptical shape. Moreover, the pixel electrode 17 may have a structure in which a projection is provided on a part of the rectangle, the ellipse, or the like; and a connecting portion for connecting the electrode with the pixel circuit 16 may be provided on this projection. Regardless of the shape of the pixel electrode 17, in the case where a problem of light emission occurs at the circumferential edge portion 40 of the pixel electrode 17 in the light emitting element 15, a large part (equal to or more than 50%) of the circumferential edge portion 40 of the pixel electrode 17 may be so configured as to be covered by the insulating layer 29. In the case where a problem of light emission does not occur in the circumferential edge portion 40 of the pixel electrode 17 in the light emitting element 15 or the problem of light emission occurs therein to a limited degree with a small influence, a large part (equal to or more than 50%) of the circumferential edge portion 40 of the pixel electrode 17 may be configured so as not to be covered by the insulating layer 29 in the light emitting element 15. In other words, in the case where the problem of light emission does not occur at the circumferential edge portion 40 of the pixel electrode 17 in the light emitting element 15 or the problem of light emission occurs therein to a limited degree with a small influence, less than 50% of the circumferential edge portion of the pixel electrode 17 may be covered by the insulating layer 29 in the light emitting element 15. With this, a light emitting device with excellent display quality and high luminance can be provided.

Moreover, the first opening 31 and the second opening 32 provided in the insulating layer 29 may take any shape; they may be a rectangle as shown in FIG. 3A, and the corners of the rectangle may have a round shape. In addition, the shape of the above openings may be a polygon, a circle, an ellipse, or the like. A shape in which a recess or a projection is provided on a part of the rectangle, the ellipse, or the like may be adopted.

Third Embodiment

Electronic Apparatus

Figure 9:
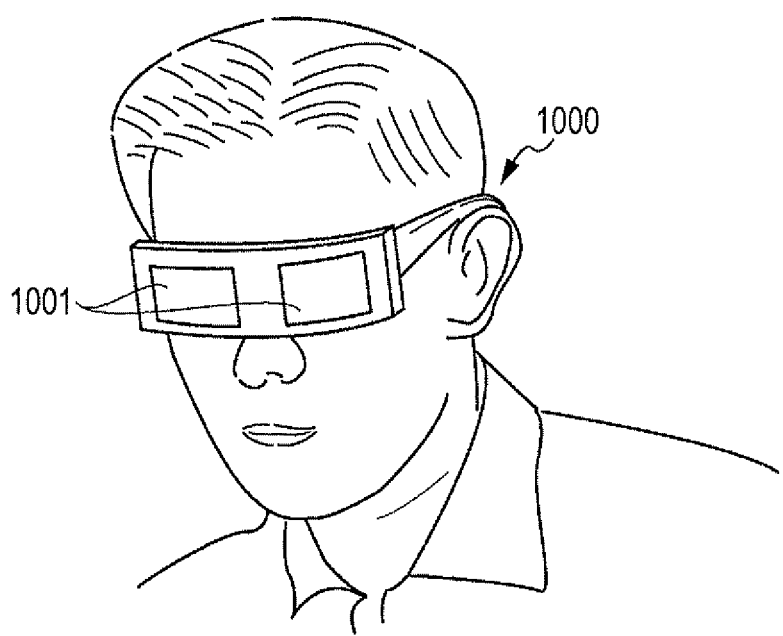
FIG. 9 is a schematic perspective view illustrating a head mount display as an electronic apparatus.

Next, an electronic apparatus according to a third embodiment of the invention will be described with reference to FIG. 9. FIG. 9 is a schematic perspective view illustrating a head mount display as an electronic apparatus.

As shown in FIG. 9, a head mount display 1000 as the electronic apparatus of this embodiment includes two display units 1001 that are provided corresponding to the right and left eyes. A viewer can see letters, images, and so on that are displayed on the display units 1001 by wearing the head mount display 1000 on the head like glasses. For example, the viewer can see and enjoy a three-dimensional picture when images considering parallax are displayed on the right and left display units 1001.

The organic EL device 1 described above is mounted on each of the display units 1001. Accordingly, the head mount display 1000 is an apparatus having excellent display quality with little color drift. Moreover, the head mount display 1000 is also an apparatus whose luminance per unit area is high because of its large aperture ratio.

The head mount display 1000 is not limited to the configuration including the two display units 1001, and may have a configuration in which one display unit 1001 is provided corresponding to any one of the right and left eyes.

The electronic apparatus on which the organic EL device 1 described above is mounted is not limited to the head mount display 1000. That is, electronic apparatuses that include display units such as a head-up display, a personal computer, a personal digital assistant, a navigator, a viewer, and so on can be cited, for example.

The entire disclosure of Japanese Patent Application No. 2012-166729, filed Jul. 27, 2012 is expressly incorporated by reference herein.

What is claimed is:

1. A light emitting device comprising:
a substrate;
a first light emitting element that is disposed above a first surface of the substrate, that has a first pixel electrode, an opposing electrode, and a functional layer containing a light emitting layer and being arranged between the first pixel electrode and the opposing electrode, and that emits first light;
a second light emitting element that is disposed above the first surface of the substrate, that has a second pixel electrode, an opposing electrode, and a functional layer containing a light emitting layer and being arranged between the second pixel electrode and the opposing electrode, and that emits second light; and
an insulating layer that is disposed between the first surface and the functional layer via the first and second pixel electrodes, and that has a first opening which exposes the first pixel electrode and a second opening which exposes the second pixel electrode,
wherein the first opening is configured so that the insulating layer covers equal to or more than 50% of a circumferential end portion of the first pixel electrode, and
the second opening is configured so that the insulating layer covers less than 50% of a circumferential end portion of the second pixel electrode.

2. The light emitting device according to claim 1,
wherein the first pixel electrode and the second pixel electrode are formed in a planar shape in which length in a first direction is longer than the length in a second direction intersecting with the first direction,
the first opening is configured so that the insulating layer covers at least an end portion along the first direction of the circumferential edge portion of the first pixel electrode, and
the second opening is configured so that the insulating layer covers at least a part of an end portion along the second direction of the circumferential edge portion of the second pixel electrode.

3. The light emitting device according to claim 1, further comprising:
a first pixel circuit that is disposed between the first surface and the first pixel electrode and that controls driving of the first light emitting element;
a first connecting portion that connects the first pixel electrode with the first pixel circuit;
a second pixel circuit that is disposed between the first surface and the second pixel electrode and that controls driving of the second light emitting element; and
a second connecting portion that connects the second pixel electrode with the second pixel circuit, wherein the insulating layer is formed overlapping the first connecting portion and the second connecting portion.

4. The light emitting device according to claim 3, wherein the first connecting portion is disposed at a side of an end portion along the second direction of the circumferential end portion of the first pixel electrode, and the second connecting portion is disposed at a side of an end portion along the second direction of the circumferential end portion of the second pixel electrode.

5. The light emitting device according to claim 1, wherein the thickness of the second pixel electrode is thinner than the thickness of the first pixel electrode.

6. The light emitting device according to claim 1, further comprising:
a third light emitting element that is disposed above the first surface, that has a third pixel electrode, an opposing electrode, and a functional layer containing a light emitting layer and being disposed between the third pixel electrode and the opposing electrode, and that emits third light,
wherein the second light emitting element and the third light emitting element are disposed being adjacent to each other in the second direction, and
the second opening stretches across the second and third pixel electrodes in the first direction intersecting with the second direction, and is configured by covering less than 50% of the circumferential end portions of the second and third pixel electrodes.

7. The light emitting device according to claim 6, further comprising:
reflective layers that are disposed between the first surface and the first, second and third pixel electrodes, respectively,
wherein the opposing electrode is a semi-transmissive reflective layer that transmits a part of light emitted from the functional layer and reflects another part of the light, and
resonator structures are formed between the reflective layers and the semi-transmissive layer respectively in the first, second and third light emitting elements.

8. The light emitting device according to claim 6, further comprising:
a third pixel circuit that is disposed between the first surface and the third pixel electrode and that controls driving of the third light emitting element; and
a third connecting portion that connects the third pixel electrode with the third pixel circuit,
wherein the insulating layer overlaps with the third connecting portion.

9. The light emitting device according to claim 6, wherein the thickness of the third pixel electrode is thinner than the thickness of the first pixel electrode.

10. The light emitting device according to claim 1, further comprising:
a fourth light emitting element that is disposed above the first surface, that has a fourth pixel electrode, an opposing electrode, and a functional layer containing a light emitting layer and being disposed between the fourth pixel electrode and the opposing electrode, and that emits the first light,
wherein the first light emitting element and the second light emitting element are disposed being adjacent to each other in the second direction,
the first light emitting element and the fourth light emitting element are disposed being adjacent to each other in the first direction intersecting with the second direction, and
the first opening stretches across the first and fourth pixel electrodes in the second direction, and is configured so that the insulating layer covers equal to or more than 50% of the circumferential end portions of the first and fourth pixel electrodes.

11. The light emitting device according to claim 10, wherein the first pixel electrode and the fourth pixel electrode are formed in a planar shape in which the length in the second direction is shorter than the length in the first direction, and
the first opening is configured so that the insulating layer covers the end portions along the first direction of the circumferential end portions of the first and fourth pixel electrodes and does not cover the end portions located adjacent to each other in the first direction among the end portions formed along the second direction.

12. A light emitting device comprising:
a substrate;
a first pixel electrode disposed above a first surface of the substrate;
a second pixel electrode disposed above the first surface of the substrate;
an opposing electrode;
a functional layer disposed between the first pixel electrode and the opposing electrode and arranged between the second pixel electrode and the opposing electrode, the functional layer including a light emitting layer;
an insulating layer disposed between the first surface and the functional layer,
wherein the insulating layer covers equal to or more than 50% of a circumferential end portion of the first pixel electrode, and covers less than 50% of a circumferential end portion of the second pixel electrode.

13. An electronic apparatus comprising:
the light emitting device according to claim 1.

14. An electronic apparatus comprising:
the light emitting device according to claim 2.

15. An electronic apparatus comprising:
the light emitting device according to claim 3.

16. An electronic apparatus comprising:
the light emitting device according to claim 4.

17. An electronic apparatus comprising:
the light emitting device according to claim 5.

18. An electronic apparatus comprising:
the light emitting device according to claim 6.

19. An electronic apparatus comprising:
the light emitting device according to claim 7.

20. An electronic apparatus comprising:
the light emitting device according to claim 8.

* * * * *